United States Patent
Alloin et al.

(10) Patent No.: US 6,804,318 B1
(45) Date of Patent: Oct. 12, 2004

(54) SYSTEM AND METHOD FOR USING A NETWORK TIMING REFERENCE CIRCUIT AS A PHASE DETECTOR IN A SYNCHRONIZATION LOOP

(75) Inventors: Laurent Alloin, Monmouth Beach, NJ (US); Daniel Amrany, Ocean Township, NJ (US); Jean-Francois Lopez, Eatontown, NJ (US)

(73) Assignee: Globespanvirata, INC, Red Bank, NJ (US)

(*) Notice: Subject to any disclaimer, the term of this patent is extended or adjusted under 35 U.S.C. 154(b) by 629 days.

(21) Appl. No.: 09/689,053

(22) Filed: Oct. 12, 2000

Related U.S. Application Data (60) Provisional application No. 60/159,182, filed on Oct. 12, 1999.

(51) Int. Cl.$^7$ ................................................. H03D 3/24
(52) U.S. Cl. ........................ 375/373; 375/371; 375/375; 375/376; 713/400
(58) Field of Search ................................ 375/373, 371, 375/375, 376; 713/400

(56) References Cited

U.S. PATENT DOCUMENTS

| | | | | |
|---|---|---|---|---|
| 6,058,152 A | * | 5/2000 | Tanishima | 375/376 |
| 6,125,158 A | * | 9/2000 | Carson et al. | 375/376 |
| 6,327,666 B1 | * | 12/2001 | Langberg et al. | 713/400 |

* cited by examiner

Primary Examiner—Shuwang Liu
Assistant Examiner—Eva Yi Zheng
(74) Attorney, Agent, or Firm—Thomas, Kayden, Horstemeyer, & Risley (57) ABSTRACT

An improvement to system clock synchronization corrector in a digital transceiver allows the generation of a phase error correction signal for use in an imbedded clock synchronization control loop without the use of additional transmitted information or additional external circuitry. The system allows a transceiver to achieve timing and synchronization lock to a system master clock, such as a T1 or E1 clock, by triggering a counter to supply a count responsive to a higher-frequency replica of the local clock signal with the network clock signal. A network timing reference unit generates a phase error offset by clocking data into comparison registers in response to the maximum counter values. Subsequent counter values are mathematically combined to generate a series of phase offset samples. The phase error samples may be stored and or further manipulated to generate a phase error correction signal for use in a clock synchronization control loop. The network timing reference unit may comprise a counter, an input register, a first comparison register, a second comparison register, and an adder. The present invention provides a method for generating a phase offset. In its broadest terms, the method can be described as: receiving a network clock and a local clock; using a higher-frequency replica of the local clock to generate a counter input signal; recording counter output values at intervals responsive to the network clock; comparing subsequent counter values at intervals responsive to a maximum value of the counter; and combining subsequent counter values to generate a series of phase error samples.

16 Claims, 8 Drawing Sheets

SYSTEM AND METHOD FOR USING A NETWORK TIMING REFERENCE CIRCUIT AS A PHASE DETECTOR IN A SYNCHRONIZATION LOOP

CROSS-REFERENCE TO RELATED APPLICATIONS

The present application claims the benefit co-pending of U.S. provisional patent application, issued Ser. No. 60/159,182, and filed Oct. 12, 1999, which is hereby incorporated by reference in its entirety.

FIELD OF THE INVENTION

The present invention relates generally to data communications, and more particularly, to a system and method for achieving timing synchronization by using a network timing reference circuit in a timing synchronization feedback control loop.

BACKGROUND OF THE INVENTION

In the field of data communications a transceiver, or modem, is used to convey information from one location to another. Digital subscriber line (DSL) technology now enables DSL transceivers to more rapidly communicate data than previously possible with purely analog modems. DSL transceivers communicate by modulating a baseband signal carrying encoded digital data, converting the modulated digital data signal to an analog signal, and transmitting the analog signal over a conventional copper wire pair using techniques that are known in the art. These known techniques include mapping the information to be transmitted into a multi-dimensional multi-level signal space constellation and slicing the received constellation to recover the transmitted information. The constellation can include both analog and digital information or only digital information.

In the above mentioned communications environment, a central office DSL transceiver is located at a telephone company central office location. Connected to the DSL transceiver via a conventional copper wire pair is a suitably configured remote DSL transceiver. The remote transceiver resides at a location, such as a residence or a business location. Before the central office transceiver can exchange information with the remote transceiver, clock timing and synchronization between the central office transceiver and a network master clock should be established.

Timing and synchronization are fundamental to any digital transmission and switching network. In a digital transmission system, timing is encoded with the transmitted signal using a network master clock, such as a T1 or E1 clock as a reference clock. As such, the central office transceiver must recover system timing and synchronization from this system clock. Once frequency synchronization between the central office transceiver and the network clock is achieved, the central office transceiver can identify frame boundaries of downstream data signals designated for further transmission to the remote transceiver. In addition, the central office transceiver can identify frame boundaries of upstream data signals received from the remote transceiver that may be designated for further transmission to other network connected devices.

In the aforementioned communications environment, synchronization is provided in a master-slave relationship such that the network timing (e.g., a T1 clock) is the master allowing it to provide timing information to all the slave data transmission systems connected to the network. Each transceiver connected to the network must be synchronized to the network system clock.

A common technique for achieving timing synchronization between the network clock and the central office transceiver is based upon the use of an external framer, which performs a bit stuffing operation. In this arrangement the aggregate bit stream has a higher data rate than the input data rate from the network. This data rate relationship accommodates the additional stuffing and framing bits. Bits are stuffed (inserted) or removed from the incoming data stream until a clock rate derived from the incoming data stream is equal to that of the input data rate from the network. This bit stuffing operation permits the transceiver to derive a local clock with a frequency that tracks the frequency of the network clock. The stuffed bits are inserted at fixed locations of each frame so that they can be identified and removed at the remote transceiver. Unfortunately, this technique requires the use of additional bits thus the technique consumes bandwidth that would otherwise be available for data transmissions.

Another known technique for achieving network timing synchronization is to lock the central office transceiver to the system clock using a voltage controlled oscillator (VCO) in conjunction with a phase locked loop (PLL). In this arrangement, the PLL synchronizes the local VCO output with the remote network clock. This ensures that the local VCO output is at the same frequency and in phase with the network clock. The local VCO output can then be used as a local clock. The local VCO output is fed back to a phase detector. The phase detector compares both the external or master clock input signal with the local VCO output. If there is a difference in frequency or phase between the two inputs, the phase detector generates an error signal. The error signal may be filtered and amplified to produce an error-correcting signal. This error-correcting signal may be applied at the local VCO to adjust the frequency and phase of the local VCO output. This hardware solution uses additional circuitry that adds system cost and complexity.

SUMMARY OF THE INVENTION

In light of the foregoing, The present invention takes advantage of a hardware circuit typically implemented on a digital signal processor (DSP) to implement a network timing reference transport mechanism to a remotely located transceiver in an xDSL application. A network timing reference unit (NTRU) is used as a phase detector embedded in a loopback system that permits synchronization of a DSL integrated circuit to an external reference clock. The system and method of the present invention provide for the synchronization of one or more derived clocks to a network system clock without the use of external bit or symbol framing or additional external circuit components. The system may be implemented in a combination of firmware and software that uses a loopback configuration that ensures after initial acquisition the locally generated clock and all clock signals derived from the local clock signal dynamically track any frequency and phase variation of the external reference clock.

A network timing reference unit generates a phase error offset by clocking data into comparison registers in response to the maximum counter values. Subsequent counter values are mathematically combined to generate a series of phase offset samples. The phase error samples may be stored and further manipulated over time to generate a phase error correction signal for use in a clock synchronization control loop. The network timing reference unit may comprise a counter, an input register, a first comparison register, a second comparison register, and an adder. The present invention provides a method for generating a phase offset. In its broadest terms, the method can be described as: receiving a network clock and a local clock; using a higher-frequency replica of the local clock to generate a counter input signal; recording counter output values at intervals responsive to the network clock; comparing subsequent counter values at intervals responsive to a maximum value of the counter; and combining subsequent counter values to generate a series of phase error samples.

Other features and advantages of the present invention will become apparent to one with skill in the art upon examination of the following drawings and detailed description. It is intended that all such additional features and advantages be included herein within the scope of the present invention, as defined in the appended claims.

BRIEF DESCRIPTION OF THE DRAWINGS

The accompanying drawings incorporated in and forming a part of the specification illustrate several aspects of the present invention, and together with the description serve to explain the principles of the invention. The components in the drawings are not necessarily to scale, emphasis instead being placed upon clearly illustrating the principles of the present invention. Moreover, in the drawings, like reference numerals designate corresponding parts throughout the several views. In the drawings.

DETAILED DESCRIPTION OF THE PREFERRED EMBODIMENT

Having summarized the invention above, reference is now made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

The present invention can be implemented in software, hardware, or a combination thereof. In the preferred embodiment, the elements of the present invention are implemented in hardware within the various circuit components of an application specific integrated circuit (ASIC) such as a suitably configured digital signal processor (DSP). In an alternative embodiment, a clock synchronization corrector in accordance with the present invention may be implemented in software that is stored in a memory and that configures and drives a suitable DSP. However, the foregoing software can be stored on any computer-readable medium for transport or for use by or in connection with any suitable computer-related system or method. In the context of this document, a computer-readable medium is an electronic, magnetic, optical, or other physical device or means that can contain or store a computer program for use by or in connection with a computer-related system or method.

While the foregoing preferred embodiment illustrates the invention in the context of a digital subscriber line (DSL) transceiver, the features of the present invention are applicable to any master-slave timing application where any device synchronizes its timing to the timing of a master clock.

Figure 1:
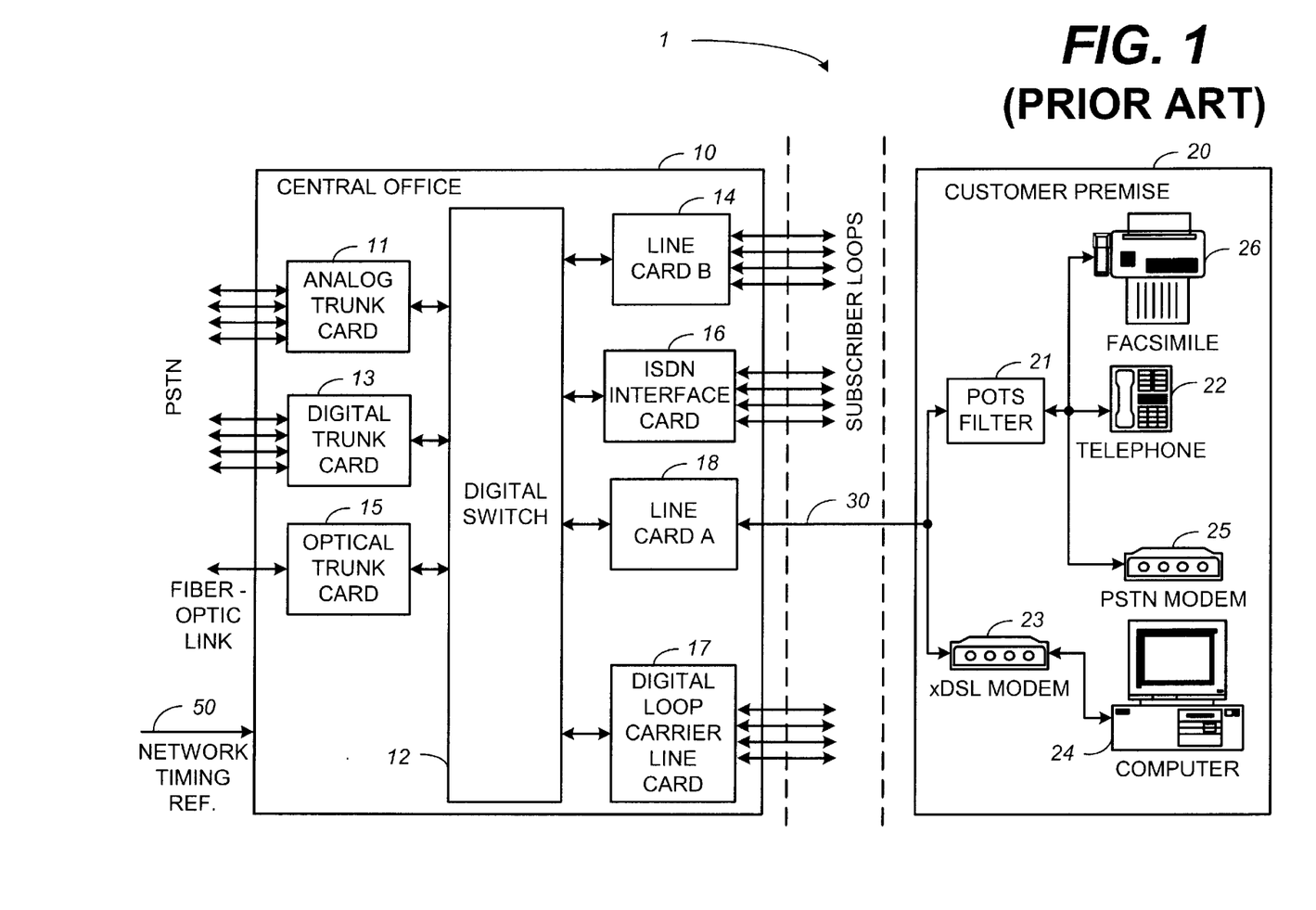
FIG. 1 is a prior art block diagram illustrating a DSL communications system between a central office (CO) and a customer premise (CP)

Turning now to the drawings, reference is directed to FIG. 1, which illustrates a prior art DSL communication system 1. Specifically, FIG. 1 illustrates communication between a central office (CO) 10 and a customer premise (CP) 20 by way of twisted-pair telephone line 30. While the CP 20 may be a single dwelling residence, a small business, or other entity, it is generally characterized as having plain old telephone system (POTS) equipment, such as a telephone 22, a public switched telephone network (PSTN) modem 25, a facsimile machine 26, etc. The CP 20 may also include an xDSL communication device, such as an xDSL modem 23 that may permit a computer 24 to communicate with one or more remote networks via the CO 10. When a xDSL service is provided, a POTS filter 21 might be interposed between the POTS equipment 22 and the twisted-pair telephone line 30. As is known, the POTS filter 21 includes a low-pass filter having a cut-off frequency of approximately 4 kilohertz to 10 kilohertz, in order to protect the POTS equipment (e.g., the phone 22 and the facsimile machine 26) from the higher frequency xDSL equipment (e.g., the xDSL modem 23 and the computer 24).

At the CO 10, additional circuitry is typically provided. Generally, a line card (i.e., Line Card A) 18 containing line interface circuitry is provided to communicatively couple various xDSL service related signals along with PSTN voice signals to the twisted-pair telephone line 30. In fact, multiple line cards 14, 18 may be provided to serve a plurality of copper telephone subscriber loops. In the same way, additional interface circuit cards are typically provided at the CO 10 to handle different types of services. For example, an integrated services digital network (ISDN) interface card 16, a digital loop carrier line card 17, and other circuit cards, for supporting similar and other communication services, may be provided.

A digital switch 12 is also provided at the CO 10 and is configured to communicate with each of the various line cards 14, 16, 17, and 18. At a PSTN interface side of the CO (i.e., the side opposite the various line cards 14, 16, 17, and 18 supporting the telephone subscriber loops), a plurality of trunk cards 11, 13, and 15 are typically provided. For example, an analog trunk card 11, a digital trunk card 13, and an optical trunk card 15 are illustrated in FIG. 1. Typically, these circuit cards have outgoing lines that support numerous multiplexed xDSL service signal transmissions.

As also illustrated in FIG. 1, a network timing reference 50 may be supplied to the CO 10 in order to coordinate the various data transfers between remote network devices (not shown) and the various line cards 14, 16, 17, 18, the digital switch 12, and the various trunk cards 11, 13, and 15 within the CO. Those skilled in the art will appreciate that in fact a plurality of various network timing reference signals may be supplied to the CO 10. It will be further appreciated that these network timing reference signals may be derived from the various data rates of signals supplied along the analog, digital, and optical trunks. For the purposes of this application, the discussion will focus on the single network timing reference 50 as illustrated.

Figure 2:
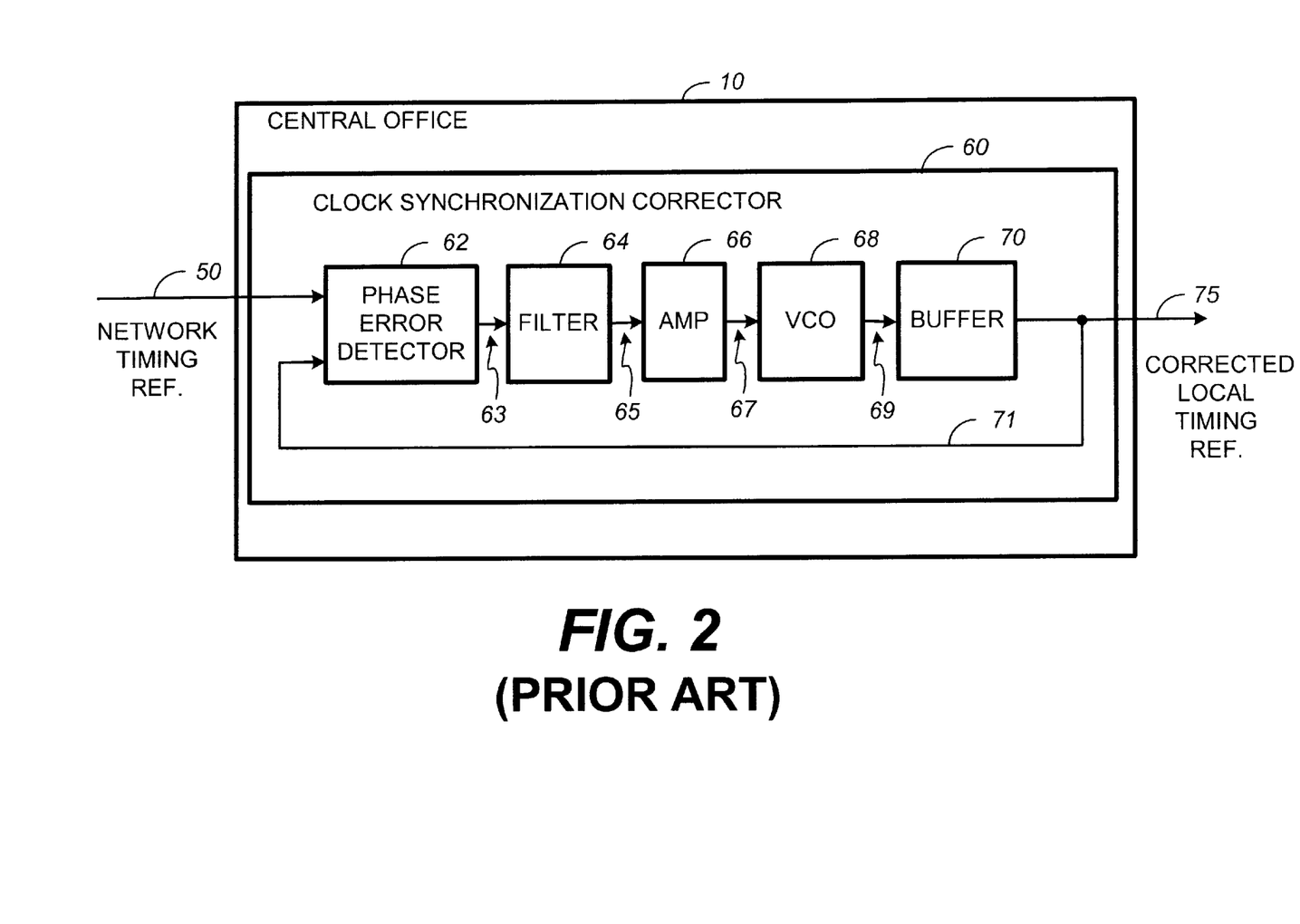
FIG. 2 is a prior art functional block diagram illustrating the use of a clock synchronization corrector as may be applied at the CO of FIG. 1 to correct a local timing reference signal in frequency and phase to a network timing reference signal.

Having introduced a conventional xDSL communication system 1 as illustrated and described in relation to FIG. 1 reference is now directed to FIG. 2, which illustrates a prior art timing reference collector. In this regard, FIG. 2 illustrates a functional block diagram of a clock synchronization corrector as may be applied at the CO 10 of FIG. 1 to correct a local timing reference signal in frequency and phase with respect to the network timing reference 50.

As illustrated in FIG. 2, a clock synchronization corrector 60 provided within the CO 10 may be configured to receive the network timing reference 50 and provide a corrected local timing reference 75. As further illustrated in FIG. 2, the clock synchronization corrector 60 may comprise a phase error detector 62, a filter 64, an amplifier (AMP) 66, a voltage controlled oscillator (VCO) 68, and a buffer 70. The phase error detector 62 may be configured to receive both the network timing reference 50 and a locally generated timing reference 75 as may be supplied by the VCO 68 or any other suitable frequency generator. The phase error detector 62 of FIG. 2 receives the local timing reference 75 by way of the feedback loop 71. Having received the network timing reference 50 and the local timing reference 75 via the feedback loop 71, the phase error detector 62 can perform a comparison of these two reference signals and output a phase error correction signal 63. As illustrated in FIG. 2, the phase error correction signal 63 may be forwarded to an input of the filter 64 which may be configured to band pass filter only those frequencies intended for control of the VCO 68. The filter 64 may be configured to supply a filtered phase error correction signal 65 to AMP 66. In a well-know manner, AMP 66 may adjust the filtered phase error correction signal 65 to a voltage level suitable to control the VCO 68.

The amplified and filtered phase error correction signal 67 supplied by an output of the AMP 66 may be either negative or positive depending on whether the local timing reference 75 supplied by the VCO 68 and buffer 70 is higher or lower in frequency and phase than the network timing reference 50. The effect of the amplified and filtered phase error correction signal 67 is to modify the VCO 68 such that the VCO output 69 matches the network timing reference 50 in frequency and phase. It will be appreciated that buffer 70 may be interposed between the VCO output 69 and the feedback loop 71 to ensure that the phase error detector load as well as loads due to external devices (not shown) that require the local timing reference 75 do not adversely affect the VCO output 69.

Figure 3:
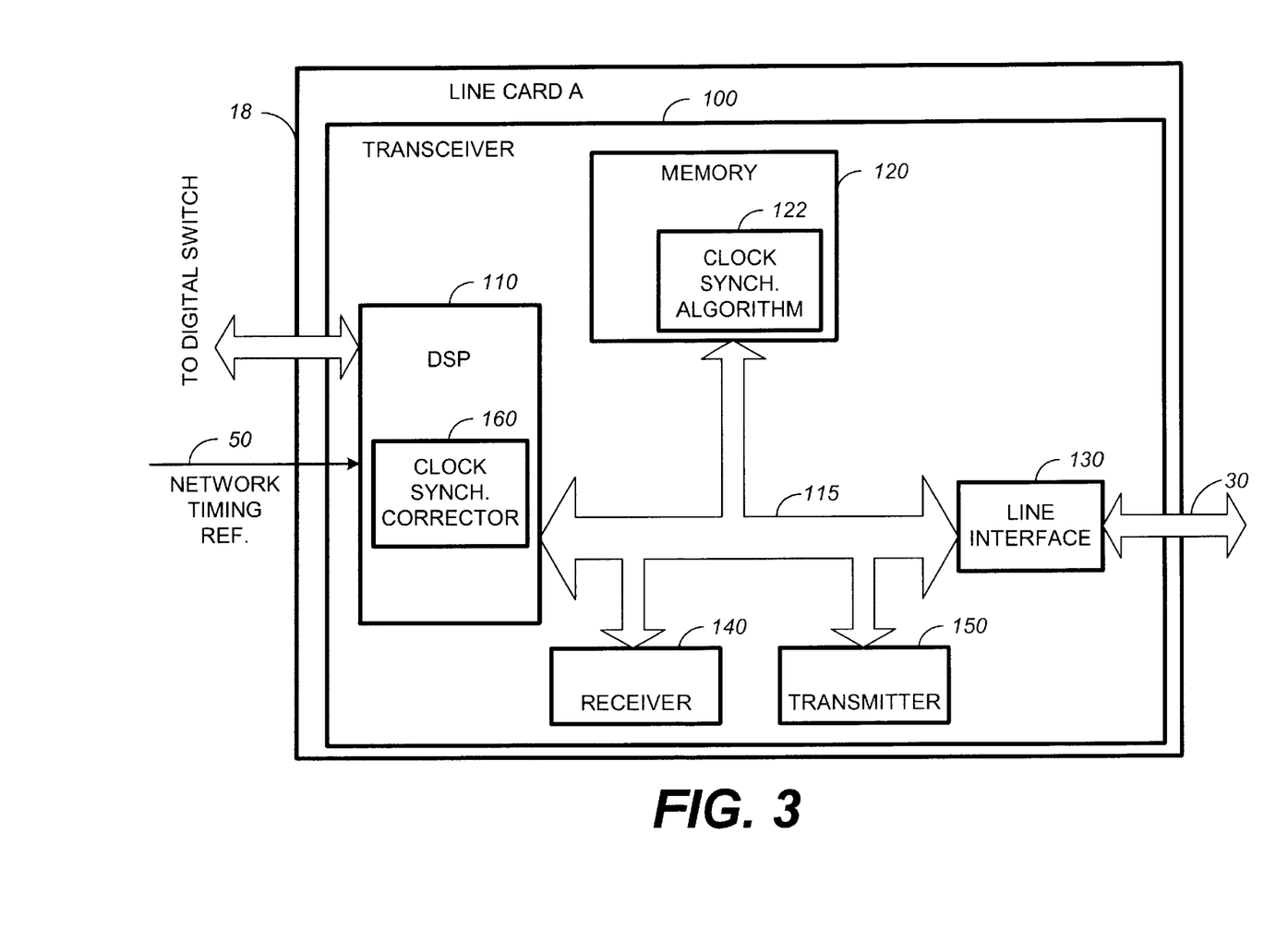
FIG. 3 is a functional block diagram illustrating an exemplary application of the improved clock synchronization corrector in accordance with the present invention within a DSL transceiver on the line card of FIG. 1.

Having introduced a clock synchronization corrector 60 as may be applied at the CO 10 of FIG. 1 to correct a local timing reference signal 75 in FIG. 2, reference is now directed to FIG. 3, which illustrates an exemplary application of the improved clock synchronization corrector in accordance with the present invention within a DSL transceiver. As illustrated in FIG. 3, line card A 18 may comprise a transceiver 100 configured to transfer and receive a plurality of upstream and downstream data transmissions respectively from a PSTN connected digital switch 12 (FIG. 1). In addition, the transceiver 100 may be configured to receive a network timing reference 50. As previously described, it will be appreciated the network timing reference 50 may be supplied within one or more downstream signals supplied to the transceiver 100. As is also illustrated in FIG. 3, the transceiver 100 may be configured to transmit and receive a plurality of upstream and downstream data transmissions to a suitably configured remote transceiver (not shown) via a twisted-pair telephone line 30.

As illustrated in FIG. 3 the transceiver 100 may comprise a DSP 110, a memory device 120, a line interface 130, a receiver 140, and a transmitter 150. As is also illustrated in FIG. 3, the various functional devices comprising the transceiver 100 may be in communication with each other via a logic interface 115. The DSP 110 may be configured to coordinate the operation of the transmitter 150 and the receiver 140 through the logic interface 115. In addition, the DSP 110 may be configured to work in conjunction with the line interface 130 to gain access to communications channel 30 that may be carried on the twisted copper wire pair that connects a CO 10 (FIG. 1) to a remotely located home or business. Also included in the transceiver 100 is the memory device 120, which may include a clock synchronization algorithm 122. As is further illustrated in the block diagram of FIG. 3, the DSP 110 may comprise an improved clock synchronization corrector 160 in accordance with the concepts and teachings of the present invention.

The clock synchronization algorithm 122 may be used in conjunction with an appropriately configured DSP 110 to perform method steps consistent with determining and correcting a frequency and phase difference in accordance with the concepts and teachings of the present invention as will be described in relation to the flowchart of FIG. 6. In the preferred embodiment the improved clock synchronization corrector 160 is implemented within an embedded loop within DSP 110. A pending U.S. patent application issued Ser. No. 09/014,155, and filed on Jan. 27, 1998, now U.S. Pat. No. 6,327,666, entitled, "System and Method for External Timing Using a Complex Rotator," and assigned to the assignee of the present application discloses a system and method for synchronizing a local clock signal to an external reference within a DSP. The contents of the previously mentioned U.S. patent application are incorporated by reference herein in their entirety.

Figure 4:
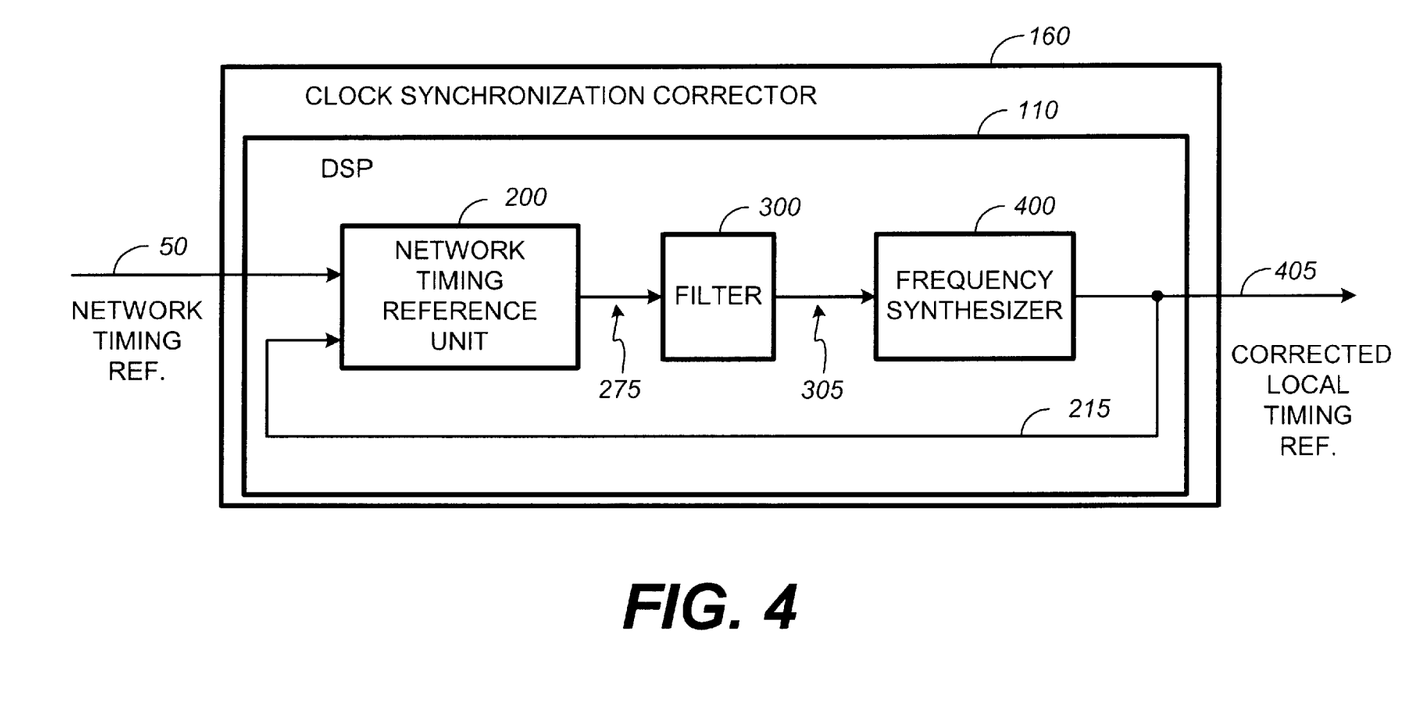
FIG. 4 is a block diagram illustrating the various functional blocks that may comprise the improved clock synchronization corrector of FIG. 3.

Reference is now directed to FIG. 4, which illustrates a functional block diagram of the improved clock synchronization corrector 160 introduced in FIG. 3. In this regard, an improved clock synchronization corrector 160 in accordance with the present invention and as illustrated in FIG. 4 may comprise a suitably configured DSP 110 having an input configured to receive the network timing reference 50 and an output configured to provide a corrected local timing reference 405. As also illustrated in FIG. 4, the DSP 110 may comprise a network timing reference unit 200, a filter 300, and a frequency synthesizer 400. The network timing reference unit 200 may be configured to receive both the network timing reference 50 and a locally generated timing reference feedback signal 215 as may be supplied by the frequency synthesizer 400. Having received the network timing reference 50 and the local timing reference feedback signal 215, the network timing reference unit 200 can perform a comparison of these two reference signals and output a phase error correction signal 275. As illustrated in FIG. 4, the phase error correction signal 275 may be forwarded to an input of the filter 300 which may be configured to modify the phase error correction signal 275 such that an appropriate input signal 305 to control the frequency synthesizer 400 is generated.

The filtered phase error correction signal 305 supplied by the filter 300 may be either negative or positive depending on whether the local timing reference 405 supplied by the frequency synthesizer 400 is higher or lower in frequency and phase than the network timing reference 50. The effect of the filtered phase error correction signal 305 is to modify the frequency synthesizer 400 such that the corrected local timing reference 405 matches the network timing reference 50 in frequency and phase.

Figure 5:
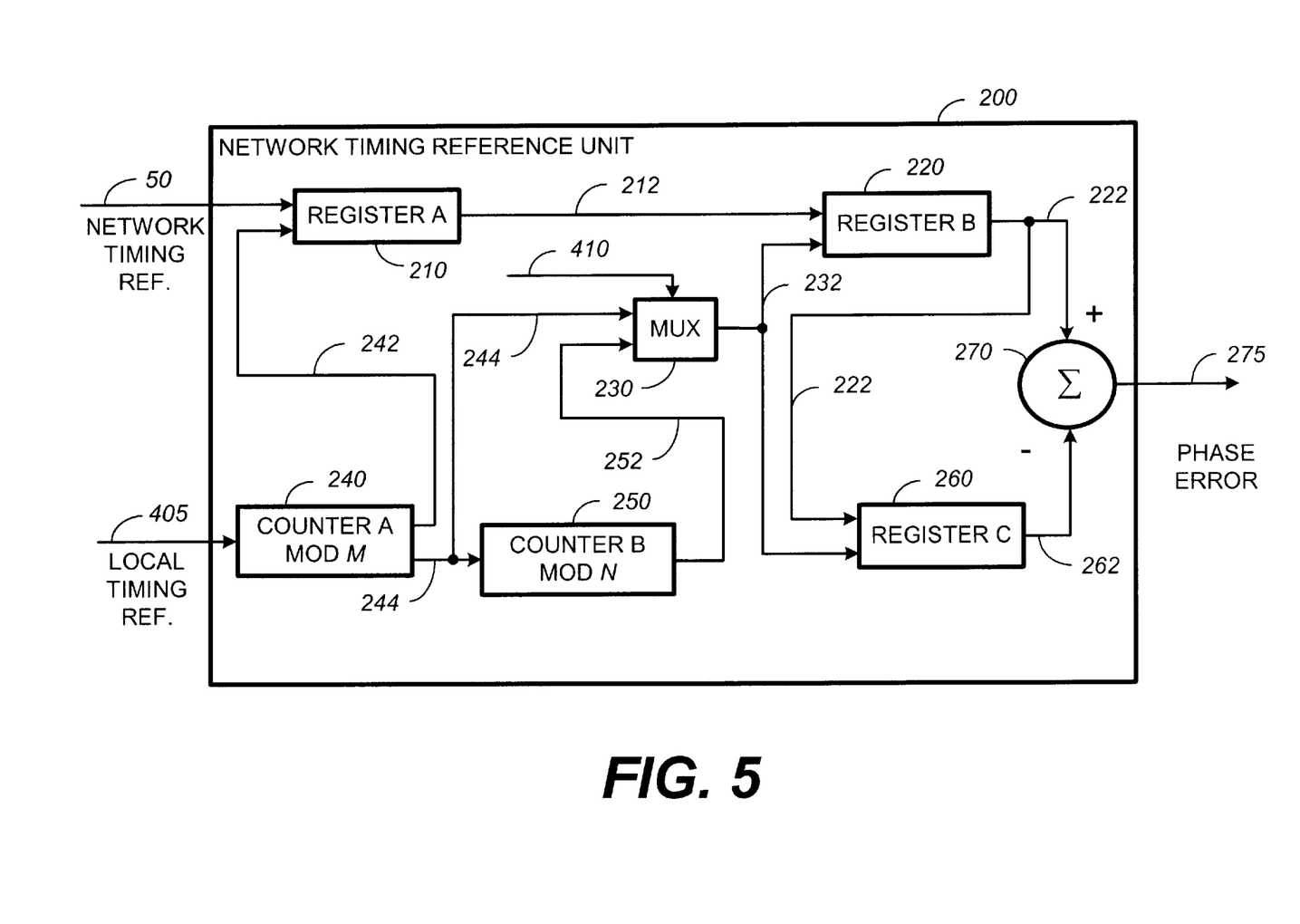
FIG. 5 is a functional block diagram illustrating an exemplary implementation of a network timing reference unit that may serve as a phase detector in the improved clock synchronization corrector of FIG. 4.

Reference is now directed to FIG. 5, which illustrates an exemplary implementation of a network timing reference unit that may serve as a phase detector in the improved clock synchronization corrector of FIG. 4. As previously described with regard to FIG. 4 and as illustrated in FIG. 5, the network timing reference unit 200 maybe configured with two inputs and an output. A first input may be configured to receive the network timing reference 50. A second input may be configured to receive a local timing reference clock 405.

As illustrated in FIG. 5, a network timing reference unit 200 in accordance with the present invention may comprise a first register 210, herein labeled, "Register A," a second register 220, labeled, "Register B," and a third register 260, labeled, "Register C." In addition, the network timing reference unit 200 may comprise a mux 230, an adder 270, a first counter 240, herein labeled, "Counter A," and a second counter 250, labeled, "Counter B." As illustrated in FIG. 5, the first counter 240 may have an input configured to receive the local timing reference 405. A first output 242 of the first counter 240 may be coupled with an input of the first register 210. A second output 244 of the first counter 240 may be coupled to the input of the second counter 250 as well as to a first input to the mux 230. As also illustrated in FIG. 5, the second counter 250 may have an output 252 that may be coupled to a second input of the mux 230. The first register 210 may have an output 212 that may be coupled to a first input of the second register 220. The second register 220 may have an output 222 that may be coupled to both a first input of the third register and a first (positive) input of the adder 270.

As is further illustrated in FIG. 5, the mux 230 may have an output 232 that may be coupled to a second input of both the second register 220 and the third register 260 respectively. The mux 230 may also be configured with a mux mode control input 410. The third register 260 may be configured with an output 262 coupled to a second (negative) input to the adder 270. Finally, the adder 270 may be configured with an output 275 that may comprise a digital representation of the phase error between the network timing reference 50 and the local timing reference 405.

The network timing reference unit 200 may perform the function of a phase error detector 62 (FIG. 2) in an embedded timing synchronization control loop formed by an improved clock synchronization corrector 160 (FIG. 4). The network timing reference unit 200 may generate a phase error correction signal 275 responsive to the phase error between two input clock signals (e.g., the network timing reference 50 and the local timing reference 405) provided that the separate frequencies of the two clock signals are related by an integer multiple or sub-multiple of each other.

The network timing reference unit 200 records a representation of the phase difference between the network timing reference 50 and the local timing reference in register A 210. The phase error representation may be subsequently clocked into register B 220 and checked against a previously recorded value of the phase difference in register C 260. A mathematical combination of the values contained in registers B 220 and C 260 may yield a set of consecutive values, which will represent a measure of the offset between the local timing reference 405 and the network timing reference 50.

By way of example, a high speed clock (e.g., a 2.208 MHz clock) may be applied to the first counter 240 that wraps around after reaching a maximum count (e.g., M, where M is a suitably sized integer). The output of the first counter 240 produces a lower frequency clock 242, 244 (i.e., 2.208 MHz /M=8 kHz for the case where M=552) that may be provided to clock in the various consecutive values of the network timing reference 50 into registers B 220 and C 260. Subtraction of the two values contained in registers B 220 and C 260 will yield a set of consecutive values, which represents a measure of the frequency offset between the local timing reference 405 and the network timing reference 50.

The example described above is representative of network timing reference unit 200 operation when the mux mode control input 410 is configured to bypass the second counter 250 (i.e., counter B). The period between consecutive value comparisons may be extended when the mux mode control input 410 is selected to no longer bypass the second counter 250. It will be appreciated that any relationship between the maximum counter values of the first counter 240 and the second counter 250 will produce a suitable functional phase error detection signal at the output of the adder 270.

It will be further appreciated that a higher frequency local timing reference 405 clock (i.e., >2.208 MHz) with a higher first counter 240 value (i.e., >552) will increase the precision of the measurement, since a step in the ramp up of the first counter 240 currently corresponds to a period of 2.208 MHz while a higher frequency local timing reference 405 clock would yield a delta T period having a shorter duration. A higher clock rate for the network timing reference 50 will provide more intermediate values to the content of the first register 240 by updating it more often but the principle remains unchanged.

In a preferred embodiment, local timing reference 405 is derived from the sampling clock of 2.208 MHz. A 100 ppm frequency offset is considered as the worst case, which would result in an average phase offset of ±3.75 clock cycles in an ADSL DMT super-frame of 17 ms. Therefore, a change in phase offset can be represented in a signed number in the–8 to+7 range in the 2's complement notation and made available in a four bits representation where the most significant bit is the sign bit. A positive value of the output of the adder 270 indicates that the local timing reference 405 is higher in frequency than the network timing reference 50. Conversely, a negative value at the output of the adder indicates that the local timing reference 405 is slow (in frequency) compared to the network timing reference.

Figure 6:
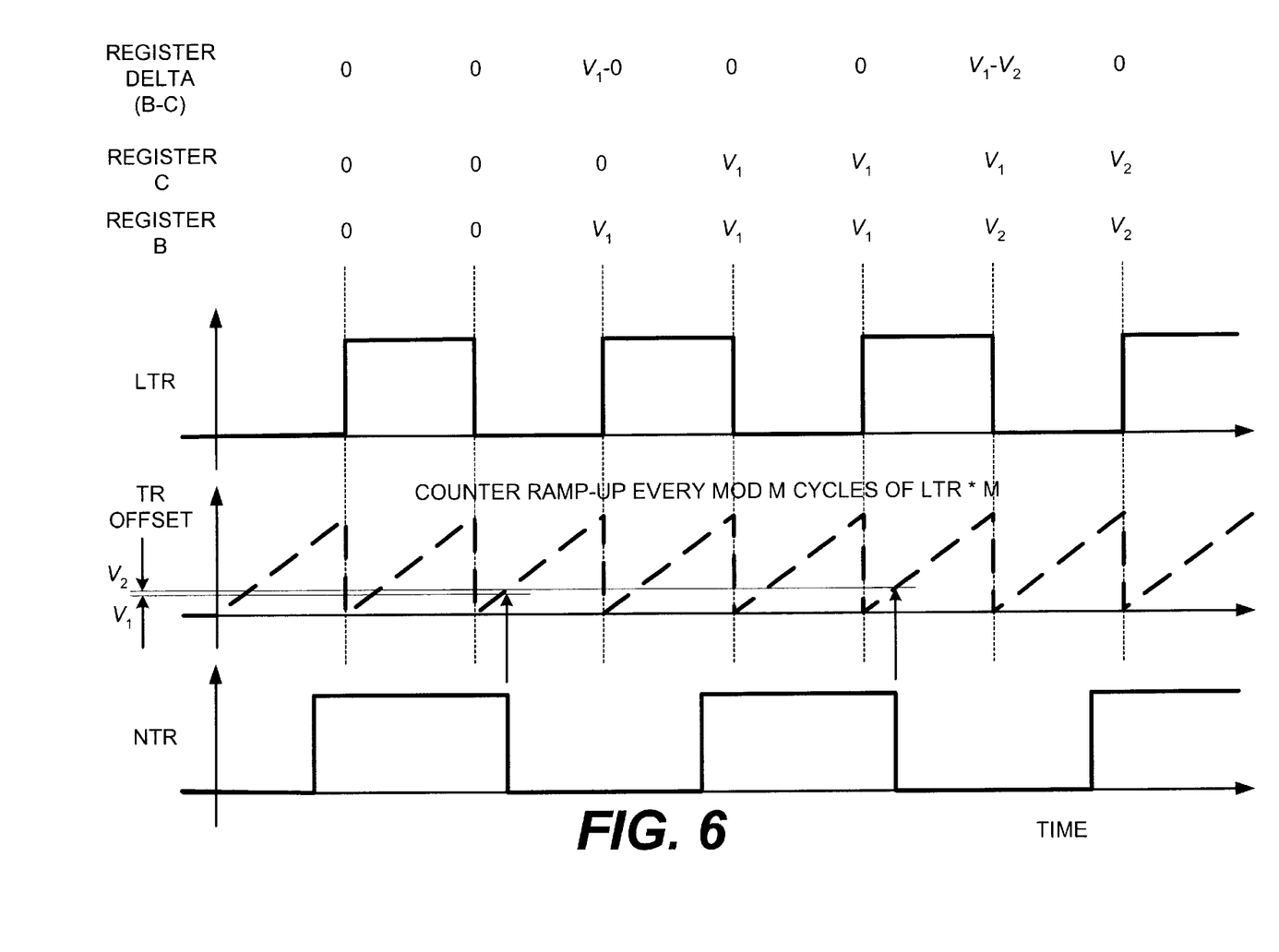
FIG. 6 is a timing diagram illustrating the relationships between a local timing reference and a network timing reference with regard to the improved clock synchronization corrector of FIG. 5.

Having described an exemplary network timing reference unit 200 with regard to FIG. 5, reference is now directed to FIG. 6, which illustrates an exemplary timing diagram illustrating the relationships between a local timing reference 405 and a network timing reference 50 with regard to the network timing reference unit 200 of FIG. 5.

As illustrated in FIG. 6, the timing diagram comprises an exemplary network timing reference 50 (FIG. 5) clock signal, herein labeled, NTR, a local timing reference 405 (FIG. 5) clock signal, labeled, LTR, and interposed there between a timing reference counter ramp up signal as may be supplied by the first counter 240 of the network timing reference unit 200 of FIG. 5. As illustrated in FIG. 6, the network timing reference unit 200 may be configured such that the network timing reference 50 clock clocks into the first register 210 the value of the first counter 240, at the following edge of the network timing reference 50 clock cycle. This first counter value 242 (e.g., $V_1$ or $V_2$) are clocked subsequently into the second register 220, when the first counter 240 reaches its maximum count of MOD M. When the first counter 240 reaches the next maximum count, the content of the second register 220 (e.g., $V_1$) is transferred into the third register 260, while a new value is clocked into the second register 220 (e.g., $V_1$). As further illustrated in FIG. 6, a mathematical combination of the values of registers B 220 and C 260 in the form of a subtraction operation provides a series of consecutive values, which represents a measure of the frequency offset between the local timing reference 405 clock signal (LTR) and the network timing reference 50 clock signal (NTR).

Figure 7:
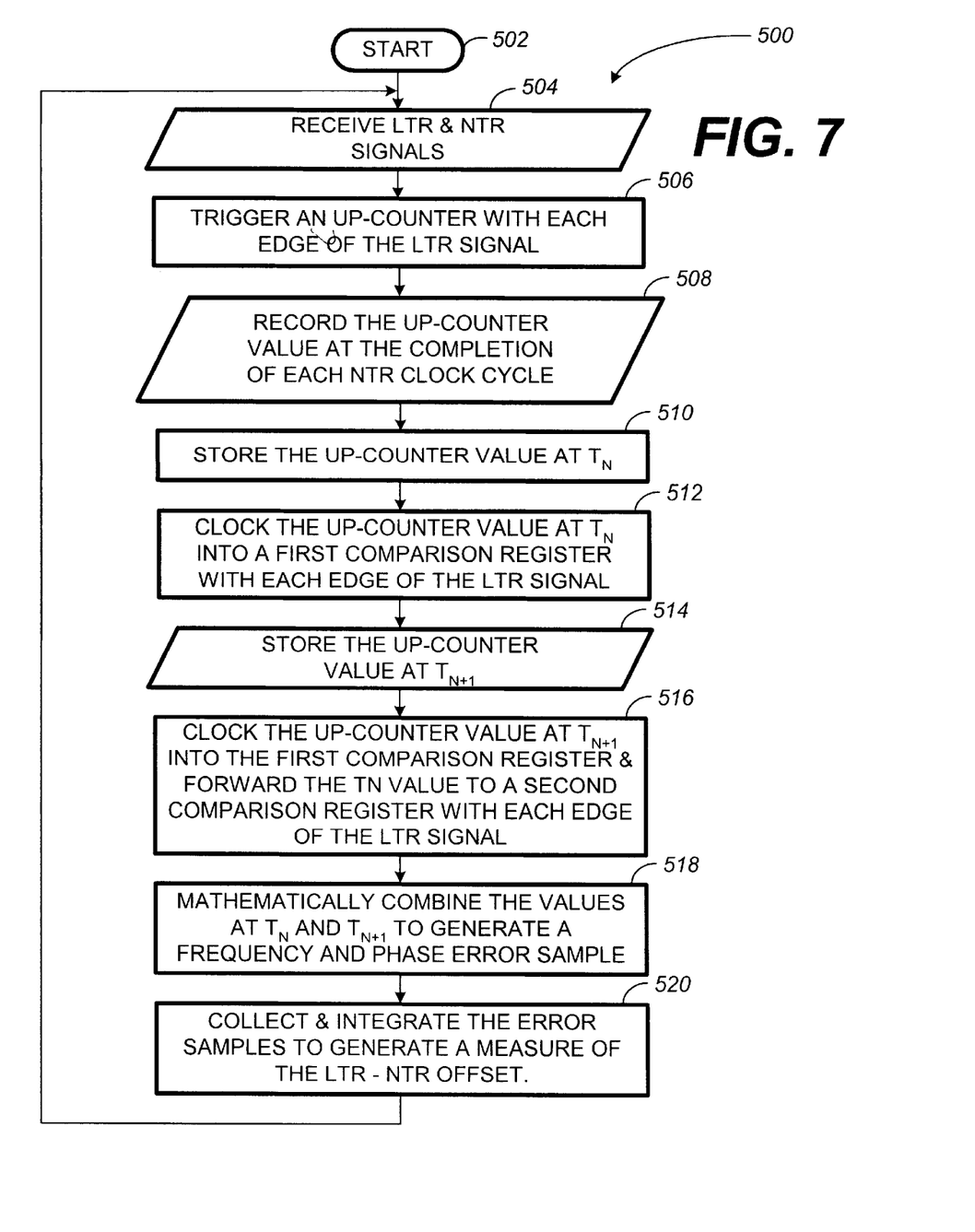
FIG. 7 is a flowchart illustrating a method for generating a phase error signal as may be performed by the network timing reference unit of FIG. 5.

Reference is now directed to FIG. 7, which illustrates a flowchart describing a method for generating a phase error offset signal as may be performed by the network timing reference unit of FIG. 5. In this regard the method for generating a phase error offset signal 500 begins with step 502 herein designated as "Start." The method for generating a phase error offset signal 500 may be configured to receive both a network timing reference (NTR) and a local timing reference (LTR) signal as indicated in step 504. Once the NTR and LTR signals are available, the network timing reference unit 200 of FIG. 5, or another suitable circuit or system, may use each rising and falling edge of the LTR clock signal to trigger an up-counter as illustrated in step 506. As illustrated in step 508 of FIG. 7, the method for generating a phase error offset signal 500 may record the up-counter value at the completion of each NTR clock cycle. The recorded up-counter value may then be stored as shown in step 510.

The method for generating a phase error offset signal 500 may continue with step 512 where each rising and falling edge of the LTR signal may be used to clock the stored up-counter value into a first comparison register. Having generated and stored the first up-counter value corresponding to a time $T_N$, the method for generating a phase error offset signal 500 may proceed by performing step 514 which may comprise storing the up-counter value at a time $T_{N+1}$. Next, the method for generating a phase error offset signal 500 may clock the up-counter value at $T_{N+1}$ into the first comparison register with each rising and falling edge of the LTR signal. Substantially simultaneously, the up-counter value corresponding to time $T_N$ may be clocked to a second comparison register as illustrated in step 516. The method for generating a phase error offset signal 500 may proceed to generate a frequency and phase error sample as shown in step 518. Last, as illustrated in step 520, the method for generating a phase error offset signal 500 may collect and integrate the frequency and phase error samples over time to generate a measure of the frequency and phase offset between the LTR and NTR signals. As further illustrated in the flowchart of FIG. 7, the method for generating a phase error offset signal 500 may proceed to repeat steps 504 through 520 as long as it is desirable to correct the LTR to the NTR.

It is significant to note that the sequence presented in FIG. 7 is by way of example only. Those skilled in the art will appreciate that particular steps may in fact be performed out of sequence or substantially simultaneously. Furthermore, the method for generating a phase error offset signal 500 as illustrated in FIG. 7 may comprise a set of processing steps that may be implemented in software and executed by a computing device in communication or integrated within the aforementioned devices. For example, each of the aforementioned devices may be in communication with but not limited to, a personal computer, a workstation, minicomputer, a controller, or a mainframe computer. The software based system, which comprises an ordered list of executable instructions for implementing logical functions, can be embodied in any computer readable medium for use by, or in connection with, an instruction execution system, apparatus, or device such as a computer based system, processor containing system, or other systems that can fetch the instructions from the instruction execution system, apparatus, or device and execute the instructions.

Figure 8A:
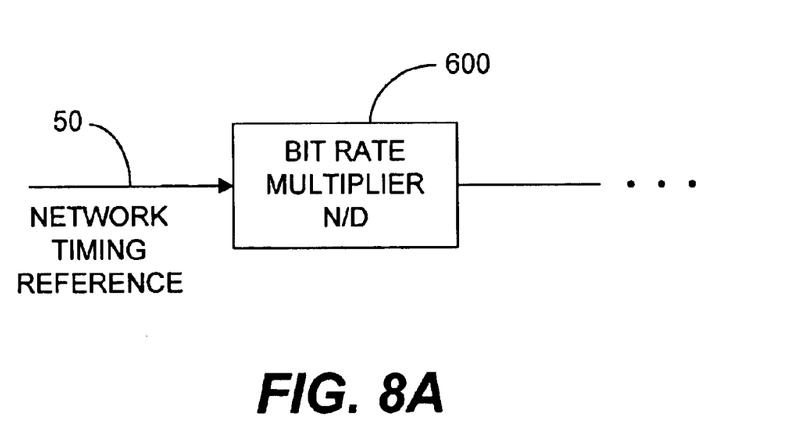
FIG. 8A shows a bit rate multiplier configured to operate on a network timing reference.

Referring now to FIG. 8A, added to network input clock line 50 is bit rate multiplier 600. Using a known in the art N/D bit rate multiplier 600, the network input clock $f_M$ is adjusted to be in an integer relation with the transceiver baud clock $f_B$ clock. The output of bit rate multiplier 600 becomes the network input clock $f_M$, however, as a result of the operation performed by bit rate multiplier 600, $f_M$ is now $f_M*N/D$. Because the network input clock has changed to $f_M*N/D$, the complex rotator function becomes $e^{-j*2*pi*n/L}$. The operation of the remaining components of the system are identical to that disclosed above with reference to FIGS. 3–5.

Figure 8B:
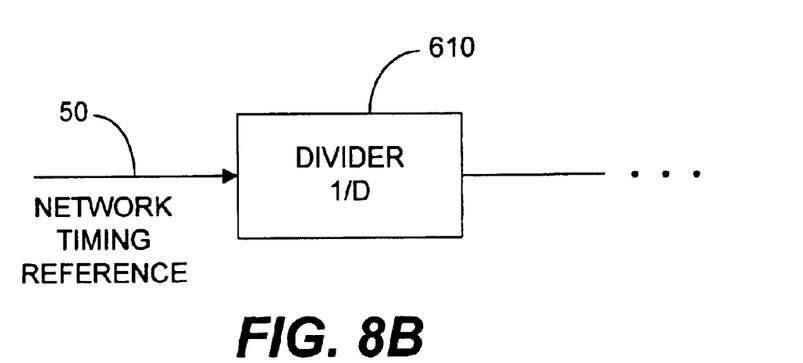
FIG. 8B shows is a second alternate embodiment of an external timing system.

Referring now to FIG. 8B, shown is a second alternate embodiment of an external timing system. As can be seen, added to network input clock line 50 is divider 610. Divider 610 generates an input clock that is integer related to the transceiver baud clock, $f_B$, by using a known in the art circuit divider. The output of divider 610 becomes the network input clock $f_M$, however, as a result of the operation of divider 610, $f_M$ is now $f_M/D$, or fb/N. Because the network input clock has changed to $f_M/D$, the complex rotator function becomes $e^{-j*2*pi*n/(L*N)}$. The operation of the remaining components of the system are identical to that disclosed above with reference to FIGS. 3–5.

In the context of this document, a "computer readable medium" can be any means that can contain, store, communicate, propagate or transport the program for use by or in connection with the instruction execution system, apparatus or device. The computer readable medium can be, for example, but not limited to, an electronic, magnetic, optical, electromagnetic, infrared or semiconductor system, apparatus, device, or propagation medium. More specific examples (a non-exhaustive list) of the computer readable medium would include the following: an electrical connection (electronic) having one or more wires, a portable computer diskette (magnetic), a random access memory (RAM) (magnetic), a read only memory (ROM) (magnetic), an erasable program read only memory (EPROM or flash memory) (magnetic), an optical fiber (optical), and a portable compact disk read only memory (CDROM) (optical). Note that the computer readable medium could even be paper or another suitable medium upon which the program is printed, as the program can be electronically captured, via for instance, optical scanning of the paper or other medium, then compiled, interpreted or otherwise processed in a suitable manner, if necessary, and then stored in a computer memory.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiments of the invention without departing substantially from the spirit and principles of the invention. For example, a VCO or a very-high frequency digital link (VDL) can be used as the frequency-synthesizing device. All such modifications and variations are intended to be included herein within the scope of the present invention and protected by the following claims.

Therefore, having thus described the invention, at least the following is claimed:

1. A system for generating a phase error correction signal, comprising:
   a counter configured to receive a representation of a local clock reference signal and to provide a first counter output responsive to the number of periods encountered in the received local clock reference signal, the counter further configured to generate a maximum count output signal;
   an input register configured to receive a network clock signal input and a data input, the input register configured to clock a data input value into the input register responsive to a change in a level of the network clock signal, the input register configured to receive the data input value from the counter, the input register further configured to supply the data input value at an input register output upon subsequent network clock signal cycles;
   a first comparison register having a first input coupled to the input register output and a second input configured to receive the maximum count output signal from the counter, the first comparison register configured to receive the data input value from the input register at the first comparison register input in response to the maximum count output signal, the first comparison register further configured to supply the data input value at a first comparison register output responsive to subsequent maximum count indications from the counter;
   a second comparison register having a first input coupled to the first comparison register output and a second input configured to receive the maximum count output signal from the counter, the second comparison register configured to receive the data input value from the first comparison register at the first input of the second comparison register in response to the maximum count output signal, the second comparison register further configured to supply the data input value responsive to subsequent maximum count indications from the counter; and
   an adder coupled to the output of the first and second comparison registers, the adder configured to mathematically combine the data values supplied by the first and second comparison registers to generate a sample phase error value that may be used to control a frequency-synthesizer within an embedded clock synchronization control loop.

2. The system of claim 1, further comprising a multiplier configured to multiply the local clock reference signal to a rate that is integer related to that of a locally generated clock.

3. The system of claim 1, further comprising a divider configured to divide the local clock reference signal to a rate that is integer related to that of a locally generated clock.

4. The system of claim 1, wherein the counter is a modulo M up-counter.

5. The system of claim 4, further comprising:
   a second counter configured to receive the maximum count output signal and to provide a second maximum count output signal; and
   a multiplexer configured to receive both the first and the second maximum count output signals, the multiplexer further configured with a mode control input such that the multiplexer forwards a control output responsive to the second maximum count output signal.

6. The system of claim 5, wherein the second counter is a modulo N up-counter.

7. A system for generating a phase offset correction signal, comprising:
   means for receiving a network clock signal;
   means for receiving a local clock signal;
   means for multiplying the local clock signal by a predetermined factor;
   means for comparing a value derived from the multiplied local clock signal with the network clock signal over time;
   means for storing the compared value at subsequent transitions of the local clock signal;
   means for mathematically combining subsequent compared values over time to generate a series of phase error samples; and
   means for integrating the phase error samples over time.

8. The system of claim 7, wherein the means for receiving a network clock signal comprises a register.

9. The system of claim 7, wherein the means for receiving a local clock signal comprises a counter.

10. The system of claim 7, further comprising a means for deriving a value responsive to the local clock signal comprises sampling a counter with a trigger provided by the network clock signal.

11. The system of claim 7, wherein the means for storing subsequent compared values comprises a first and a second register.

12. The system of claim 7, wherein the means for mathematically combining subsequent compared values over time comprises an adder.

13. A method for generating a phase error offset signal, comprising:
   receiving a network timing reference signal and a local timing reference signal;
   applying an integer multiplier to the local timing reference signal to generate a higher-frequency counter input signal;
   recording a counter output value at intervals responsive to the network timing reference clock;
   comparing subsequent counter values at intervals responsive to a maximum value of the counter;
   combining subsequent counter values to generate a series of error offset samples; and
   applying the error offset samples in an embedded clock synchronization control loop.

14. The method of claim 13, wherein the step of comparing subsequent counter values is performed at an interval responsive to a maximum counter value of a second counter.

15. The method of claim 13, wherein the step of combining subsequent counter values comprises subtracting an earlier value from a later value.

16. The method of claim 14, wherein the second counter is driven by a maximum value signal derived from the counter used to generate counter values.

* * * * *